United States Patent [19]
Cummings et al.

[11] Patent Number: 5,115,210
[45] Date of Patent: May 19, 1992

[54] MICROWAVE OSCILLATOR USING A RING RESONATOR AND OPERABLE AS A REMOTE TEMPERATURE SENSOR

[75] Inventors: Michael Cummings, Howell; Roland Cadotte, Jr., Freehold; Adam Rachlin, Eatontown, all of N.J.

[73] Assignee: The United States of America as represented by the Secretary of the Army, Washington, D.C.

[21] Appl. No.: 687,601

[22] Filed: Apr. 15, 1991

[51] Int. Cl.$^5$ .................... H03B 5/18; G01K 7/00
[52] U.S. Cl. ........................ 331/99; 331/66; 331/117 D; 331/117 FE; 374/183
[58] Field of Search .............. 331/96, 107 SL, 117 D, 331/99, 117 FE, 65, 66; 374/183

[56] References Cited
U.S. PATENT DOCUMENTS 4,185,252  1/1980  Gerlach .................. 331/107 SL X
4,749,963  6/1988  Makimoto et al. ............. 331/99

OTHER PUBLICATIONS

GaAs MESFET Circuit Design, R. Soares, pp. 361–375, Artech House, Inc., 1988.
A Highly-Stable 36 GHz GaAs FET DRO with Phase-Lock Capability, A.P.S. Khanna et al., *Microwave Journal*, Jul. 1989, pp. 117–122.

*Primary Examiner*—Siegfried H. Grimm
*Attorney, Agent, or Firm*—Michael Zelenka; William H. Anderson

[57] ABSTRACT

An ambient condition sensor is embodied in an oscillator which generates an output signal having a frequency which is proportional to the ambient condition of the environment in which it is located. The oscillator includes a ring resonator consisting of a metallic ring located in the output plane of a grounded source gallium arsenide MESFET type transistor oscillator formed on a temperature sensitive dielectric substrate. The circumference of the ring is directly related to the ring resonator's resonant frequency. More particularly, the circumference of the ring is a multiple of the wavelength of the oscillator's output signal. Such a device permits unmanned, remote and inexpensive temperature sensing in places generally unsuited for operator presence.

11 Claims, 1 Drawing Sheet

MICROWAVE OSCILLATOR USING A RING RESONATOR AND OPERABLE AS A REMOTE TEMPERATURE SENSOR

GOVERNMENT INTEREST

The invention described herein may be manufactured, used and licensed by or for the Government for Governmental purposes without the payment to us of any royalty thereon or therefor.

FIELD OF THE INVENTION

This invention relates to microwave signal sources and more particularly to a temperature sensor in the form of a microwave oscillator whose output frequency is proportional to temperature.

BACKGROUND OF THE INVENTION

Stable microwave and millimeter wave signal sources fabricated via microstrip or planar circuit techniques on substrates are well known and are typically in the form of fixed frequency oscillators. One type of such oscillator comprises what is known as a dielectric resonator oscillator, an example of which is disclosed in, "A Highly Stable 36 GHz GaAs FET DRO with Phase Lock Capability," Microwave Journal, July 1989, by Khanna et al. This type of resonator oscillator uses a dielectric resonator to control the frequency of an oscillator by either a frequency "stabilized" DRO or as a frequency "stable" DRO. Khanna et al page 117.

Another type of oscillator is the ring resonator oscillator which exhibits not only relatively good frequency stability, but is simple in its circuit configuration. Moreover, transistor ring resonator oscillators integrate readily into miniature and microminiature integrated circuit technology where gallium arsenide (GaAs) field effect transistors (FET) are typically used. The details of a microstrip ring resonator oscillator are generally shown and disclosed in U.S. Pat. No. 4,185,252, entitled, "Microstrip Open Ring Resonator Oscillator", and issued to Gerlach on Jan. 22, 1980, which is incorporated herein by reference.

Both dielectric resonators and ring resonators work in a similar manner (the dielectric resonator may be substituted for the ring resonator). However, dielectric resonators are difficult to fabricate because a very small change in the position of the dielectric resonator can cause a large change in coupling resulting in a large frequency shift. Therefore, positioning the dielectric resonator is a labor intensive procedure. In contrast, ring resonators are processed directly on the circuit and need no extra time to position. The present invention is an adaptation of a ring resonator oscillator.

SUMMARY OF THE INVENTION

It becomes an object of the present invention, therefore, to provide an improvement in resonator oscillators.

It is another object of the invention to provide an oscillator which is adapted to operate as an ambient condition sensor.

Still another object of the invention is to provide an oscillator which is adapted to operate as an unmanned remote, inexpensive ambient condition sensor for use in a variety of environments.

Briefly, the foregoing and other objects of the invention are provided by a remote ambient condition sensor comprised of an oscillator which generates a highly stable frequency or an output signal having a frequency which is proportional to the ambient conditions of the environment in which it is located. In its preferred embodiment, the oscillator includes a ring resonator comprised of a metallic ring located in the output plane of a grounded source gallium arsenide MESFET type transistor oscillator formed on a sensitive dielectric substrate where the circumference of the ring is directly related to the ring resonator's resonant frequency. More particularly, the circumference of the ring is a multiple of the wavelength of the oscillator's output signal.

BRIEF DESCRIPTION OF THE DRAWING

The following detailed description of the invention will be more readily understood when considered together with the accompanying drawing in which.

DETAILED DESCRIPTION

Figure 1:
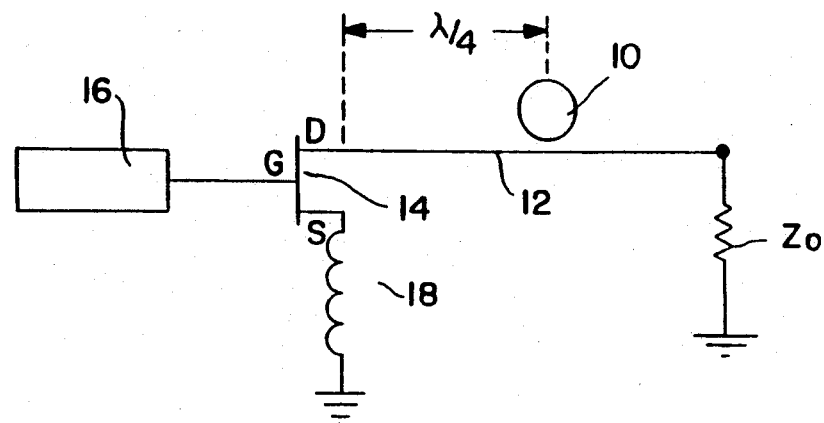
FIG. 1 is an electric schematic diagram of a ring resonator oscillator embodying the present invention.

Referring now to the drawings and more particularly to FIG. 1, shown thereat is a schematic diagram illustrative of what is known as a ring resonator oscillator (RRO). As shown, a small ring resonator element 10 is located adjacent the output circuit line 12 coupled to the drain (D) electrode of a field effect (FET) transistor 14, which may comprise a gallium arsenide transistor. Further as shown, the gate (G) is coupled to a microstrip or planar circuit 16, while the source (S) is coupled to a inductor 18 shown connected to ground. A load resistor is connected to the output line 12 and is equal to the characteristic impedance Zo. The ring resonator element 10 is located one quarter wavelength ($\lambda/4$) away from the drain electrode (D) and acts as a feedback/frequency determining element.

In operation, the resonator 10 comprises a low Q metallic ring whose physical dimensions dictate the principal frequency of operation, fo. In FIG. 1, the ring resonator 10 acts as a passive stabilization element which is used in the output plane of the circuit to stabilize an otherwise free running oscillator.

Figure 2:
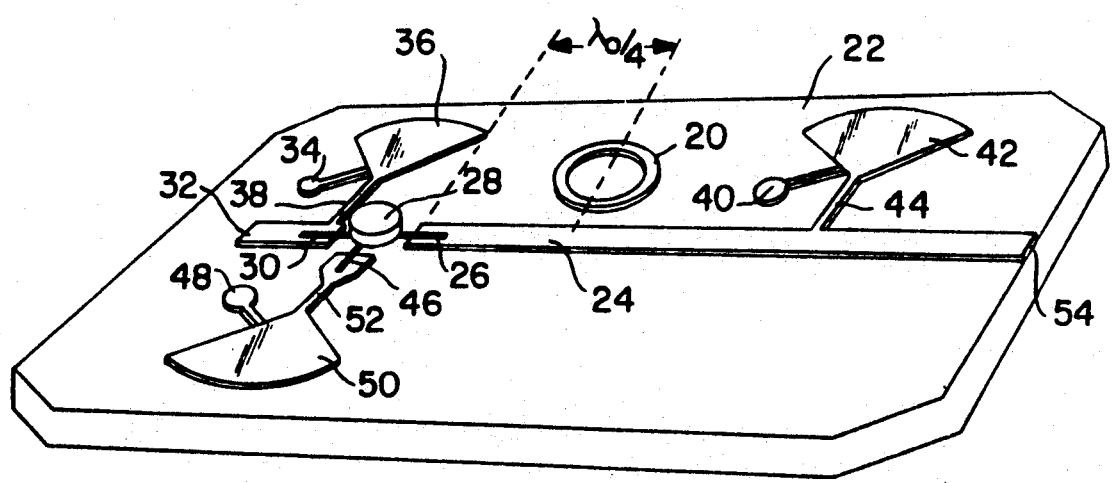
FIG. 2 is a perspective view illustrative of the details of the preferred embodiment of the subject invention.

Referring now to FIG. 2, wherein there is shown the preferred embodiment of the invention, reference numeral 20 denotes an annular metallic ring which is located on a substrate 22 adjacent a length of planar circuitry 24 connected to the drain (D) electrode 26 of a GaAs MESFET 28. The gate (G) electrode 30 is connected to a relatively shorter length of planar circuitry 32 also disposed on top of the substrate 22. A biasing decoupling network including a DC bonding pad 34 and a radial low-impedance RF line section 36 with a high impedance line section 38 is connected to the gate metallization 32. Another biasing decoupling network comprised of the DC bonding pad 40 and a radial low impedance line 42 with high impedance section 44 is coupled to the drain metallization 24. In a like manner, the source (S) electrode 46 is coupled to a third biasing decoupling network also comprised of a DC bonding pad 48, and a radial low-impedance line section 50 with a high impedance line section 52.

The metallic ring 20 operates to stabilize frequency when the proper impedance is presented to the MESFET's three terminals, the drain (D), the gate (G), and the source (S). An oscillation occurs when the real part of the FET's impedance is negative and has a magnitude greater than the real part of the load impedance which is determined by the ring resonator's physical characteristics. The circumference of the ring determines the natural resonant frequency, fo, of the oscillator circuit formed thereby and whose output signal is supplied to the outer edge 54 of the line 24 where it is coupled to a load resistor, not shown.

The precise frequency of oscillation occurs when the imaginary part of these two impedances cancel. The ring resonator 20 stabilizes the oscillation frequency by presenting a large reactance change vs. frequency at its resonant frequency. If the oscillator is operating at its resonant frequency and is subjected to an external disturbance, such as a change in temperature or pressure, the imaginary part of the FET's output impedance will change. However, since the ring resonator presents a rapidly changing reactance as a function of frequency, the two reactances from the FET and load will again cancel resulting in an extremely small frequency shift from the resonant frequency and as a result stable frequency operation is achieved.

Operating in this manner, the choice of substrate material is critical. When the substrate 22 is comprised of alumina, a highly stable GaAs FET oscillator is obtained which may be fabricated at a relatively low cost. However, many other types of sensitive material may be used to achieve frequency stability with the present invention.

In a like manner, when the substrate is comprised of a temperature sensitive material such as the dielectric substrate material marketed by P. T. Rogers Corporation known as "Duroid" and preferably the material marketed as "Duroid 6002", the ring resonator will still stabilize the oscillator, but because the oscillator circuitry and resonator is placed on a temperature sensitive material, the ring's resonant frequency will shift proportionately with a change in ambient conditions such as a change in temperature or pressure. It has been experimentally verified that the frequency of oscillation shifts proportionally with temperature when Duroid 6002 is used because this shift coincides with the ring resonator's resonant frequency.

A temperature sensor is thus obtained where its oscillation frequency can be shifted, for example, 60 MHz at X-band over a 60 F. temperature change. Such a device will permit unmanned, remote and inexpensive temperature sensing in a variety of environments including intense heat or cold, the upper atmosphere and hostile environments such as a battlefield. Operating in a like manner, the present invention may also be utilized to detect stress applied to the substrate and therefore, the present invention may be utilized to detect stress on a load bearing member, for example.

Thus what has been shown and described is a relatively simple microwave oscillator whose output frequency vs. temperature or pressure characteristic is variable so as to act as a highly stable oscillator or an ambient condition sensor.

Having thus shown and described what is at present considered to be the preferred embodiment of the invention, it should be noted that the same has been made by way of illustration and not limitation. Accordingly, all modifications, alterations and changes coming within the spirit and scope of the invention are herein meant to be included.

What is claimed is:

1. A microwave oscillator, comprising:
   a substrate;
   a transistor located on a surface of the substrate and including a control electrode and first and second current conducting electrodes;
   a first length of planar circuitry and a biasing decoupling network formed on said surface of the substrate and connected to said control electrode;
   a second and relatively longer length of planar circuitry and another biasing decoupling network formed on said surface of the substrate and connected to said first current conducting electrode, said another biasing decoupling network being located at a predetermined distance away from said first current conducting electrode;
   a third biasing decoupling network formed on said surface of the substrate and connected to said second current conducting electrode; and
   an annular metallic ring member having a predetermined circumference located adjacent said second length of planar circuitry a predetermined distance away from and between an edge of said second length of planar circuitry connected to said first current conducting electrode and said another biasing decoupling network, whereby upon biasing potentials being selectively applied to said biasing decoupling networks, said oscillator generates a highly stable output signal of a frequency which is a function of the circumference of said ring member.

2. The microwave oscillator as defined by claim 1 wherein the wavelength of said output signal is a multiple of the circumference of said ring member.

3. The microwave oscillator as defined by claim 2 wherein said predetermined distance from said edge comprises a quarter wavelength of said output frequency.

4. The microwave oscillator as defined in claim 3 wherein said transistor comprises a field effect transistor, said control electrode comprises the gate thereof, the first current conducting electrode comprises the drain thereof, and the second current conducting electrode comprises the source thereof.

5. The microwave oscillator as defined by claim 4 wherein said field effect transistor comprises a GaAs MESFET.

6. The microwave oscillator as defined by claim 5 wherein said substrate is comprised of alumina.

7. The microwave oscillator as defined by claim 5 wherein said substrate is comprised of temperature sensitive dielectric material which causes the output frequency to shift as a function of temperature and thereby operate as a temperature sensor.

8. The microwave oscillator as defined by claim 7 wherein said temperature sensitive dielectric material effects a proportional shift of the output frequency.

9. The microwave oscillator as defined by claim 8 wherein said dielectric material comprises a "Duroid" dielectric material.

10. The microwave oscillator as defined by claim 8 wherein said dielectric material comprises "Duroid 6002" dielectric material.

11. The microwave oscillator as defined by claim 1 wherein each said biasing decoupling network includes a DC bonding pad and an RF isolation section comprised of a radial impedance line.

* * * * *